United States Patent
Pang et al.

(10) Patent No.: US 7,485,017 B2
(45) Date of Patent: Feb. 3, 2009

(54) PIN GRID ARRAY PACKAGE SUBSTRATE INCLUDING PINS HAVING ANCHORING ELEMENTS

(75) Inventors: Mengzhi Pang, Phoenix, AZ (US); Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/758,338

(22) Filed: Jun. 5, 2007

(65) Prior Publication Data
US 2008/0305655 A1    Dec. 11, 2008

(51) Int. Cl.
*H01R 4/02*    (2006.01)
(52) U.S. Cl. .......................................... 439/876; 439/83
(58) Field of Classification Search ................ 439/876, 439/83; 174/267; 257/697
See application file for complete search history.

(56) References Cited

U.S. PATENT DOCUMENTS

| | | | | |
|---|---|---|---|---|
| 5,410,452 A | * | 4/1995 | Sinclair et al. ............... | 361/791 |
| 6,049,039 A | * | 4/2000 | Fushimi ..................... | 174/68.1 |
| 6,270,362 B1 | * | 8/2001 | Guran et al. .................. | 439/83 |
| 6,359,332 B2 | * | 3/2002 | Shiraishi ...................... | 257/697 |
| 6,623,283 B1 | * | 9/2003 | Torigian et al. ............... | 439/83 |
| 6,896,526 B2 | * | 5/2005 | Pitzele ......................... | 439/83 |
| 7,118,425 B2 | * | 10/2006 | Chen .......................... | 439/736 |
| 2008/0009155 A1 | * | 1/2008 | Ide et al. ...................... | 439/83 |

FOREIGN PATENT DOCUMENTS

JP            03190063 A  *  8/1991

* cited by examiner

*Primary Examiner*—Hae Moon Hyeon
(74) *Attorney, Agent, or Firm*—Blakely, Sokoloff, Taylor & Zafman LLP

(57) ABSTRACT

A microelectronic package substrate and an electrically conductive pin. The substrates includes: a die-side surface adapted to receive a die thereon; a printed circuit board (PCB)-side surface adapted to be mechanically and electrically bonded to a PCB; an array of land pads on the PCB-side surface, the land pads defining anchoring recesses therein; an array of electrically conductive pins electrically and mechanically bonded to respective ones of the land pads, the pins having anchoring elements thereon mated with corresponding ones of the anchoring recesses of the land pads, the anchoring elements and anchoring recesses being configured such that a mating thereof inhibits a tilting of the pins on the land pads; and a plurality of pin-attach solder joints mechanically and electrically bonding the pins to corresponding ones of the land pads.

12 Claims, 3 Drawing Sheets

PIN GRID ARRAY PACKAGE SUBSTRATE INCLUDING PINS HAVING ANCHORING ELEMENTS

FIELD

Embodiments of the present invention relate generally to pin grid array package substrate configurations.

BACKGROUND

Pin grid array (PGA) packages are well known in the art. During flip chip attach of a microelectronic die to a substrate including a PGA thereon, a reflow process typically occurs at high temperatures, such as, for example, at about 230 degrees Celsius to join solder bumps on the PGA substrate to conductive bumps, typically Cu bumps, on the die. The reflow process softens and melts not only the solder bumps on the PGA substrate, but also the solder, such as SnSb (sometimes alloyed with Au from the substrate lands), that is typically used to attach the pins of the PGA to lands on the package substrate (hereinafter "'pin-attach solder'"). In addition to a softening of the pin-attach solder reflow of the solder bumps on the PGA substrate volatile material trapped in the pin-attach solder tends to vaporize and, along with any air voids trapped in the pin-attach solder, try to escape from the same. A softening of the pin-attach solder and movement of the vaporized volatile material and air voids therein during reflow contribute to lift the pin and cause a tilting of the pins supported by the pin-attach solder. The above problem is exacerbated as pins are getting smaller and therefore lighter, and as pin count/pin density increases.

The above problem is exacerbated by the use of lead free C4 solder metallurgy and NiPdAu surface finishing. Specifically speaking, the increase of the melting point of lead-free SnAg solder over eutectic SnPb requires the peak temperature of a typical die attachment process to be about 230 degrees Celsius, which overlaps the melting range of the pin attach solder SnSb, As a result, a softening of the SnPb occurs, which may result in up to about 20% pin tilt failure of assembled packages. A second aspect of the problem is that, as compared with a pairing of SnSb with ENIG, SnSb displays poorer wetting interaction with NiPdAu, which may result in more solder voiding entrapment under the pins. Limited x-sectional observation shows about 30% of pins in such a situation as having voids greater than 200 microns. The presence of such large voids can also result in mechanically weak PGA joints as well as in pin movement.

FIG. 1 shows a PGA joint formed according to the prior art. In FIG. 1, a side view is shown of one of a pin 1 in a tilted state after C4 bumping. The pin 1 is shown as being mounted onto substrate 5. Pin 1 includes a pin stem 2 and a pin head 4 attached to the pin stem. The pin head 4 is shown as being mounted onto a land pad 8 on a PCB-side surface 6 of substrate 5 using a pin-attach solder joint 10 as shown. As seen in FIG. 1, the pin-attach solder joint 10 includes voids therein which have tilted the pin 1 for the reasons explained above, thus weakening the electrical and mechanical bond between pin 1 and land pad 8.

The prior art attempts to address the problem of pin tilt include reducing the reflow temperature in order to control a softening of the pin-attach solder and a movement of vaporized volatile material therein. Doing so has shown to improve pin tilt yields, but, disadvantageously, requires very accurate control of the C4 die attach process, even during high volume manufacturing, and further increases the risk for non wets/de-wets on the die to substrate interconnection. The above method may cause insufficient solder joint strength and more void entrapment during C4 die attach simply because a lower peak temperature can jeopardize the processing window for C4 attachment.

Another way the prior art attempts to address the issue of pin tilt is by providing additional tooling to hold the pins in place during reflow. However, disadvantageously, such a measure would not only require the provision of additional equipment, but also an accurate control and alignment of such equipment in order to ensure an adequate hold on the pins.

The prior art fails to provide an effective method of minimizing pin tilt during flip chip attach of a die to a PGA substrate.

Figure 1:
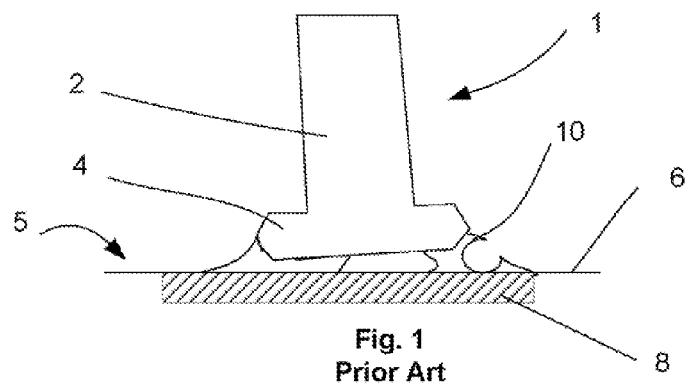
FIG. 1 is a schematic side view of a prior art PGA joint including a tilted conductive pin.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic package, a solder alloy used to form the package, a method to make the solder alloy, and a system including the package are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Aspects of this and other embodiments will be discussed herein with respect to FIGS. 2-6 below. The figures, however, should not be taken to be limiting, as it is intended for the purpose of explanation and understanding.

Figure 2:
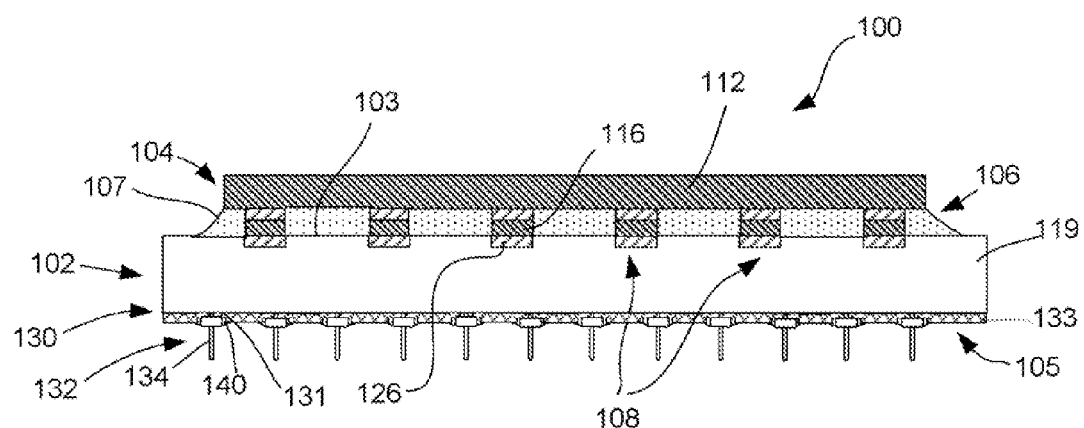
FIG. 2 is a schematic, side cross sectional view of a microelectronic package according to one embodiment.

Referring first to FIG. 2, a microelectronic package 100 is shown according to one embodiment. Package 100 includes a package substrate 102, and a die 104 bonded to the substrate by a bond 106. The substrate 102 includes a die-side surface 103 which is adapted to receive die 104 thereon, such as by including under-bump metallization or UBM in the form of lands 126. As seen in FIG. 2, a plurality of joint structures 108 are shown between the die 104 and the substrate 102, the joint structures 108 forming at least part of bond 106. Optionally, the bond 106 may also include an underfill material 107 provided in a well known manner. The substrate 102 further includes a PCB-side surface 105 adapted to electrically and mechanically couple the package 100 to a printed circuit board or PCB in a well known manner. The PCB-side surface 105 includes a surface of a solder resist layer 133, layer 133 being disposed on a substrate base 119, both layer 133 and base 119 being part of the substrate 102. Substrate 102 further includes an array 130 of land pads 131 on the PCB-side surface 105 of substrate 102, the land pads being in registration with openings in the solder resist layer 133. By "land pad," what is meant in the context of the instant application is a site on a substrate, such as a package substrate, adapted to allow an electrical and mechanical joining of the substrate with another microelectronic component, such as through a solder connection or through a PGA. The substrate 102 as shown includes a PGA substrate and thus comprises an array 132 of electrically conductive pins 134 electrically and mechanically bonded to respective ones of the land pads 131. As seen in the embodiment of FIG. 2, and as will be explained in further detail with respect to the embodiments of FIGS. 3-5, the land pads 131 on the PCB-side surface define anchoring recesses therein, and the pins 132 have anchoring elements thereon mated with corresponding ones of the anchoring recesses of the land pads, the anchoring elements and anchoring recesses being configured such that a mating thereof inhibits a tilting of the pins on the land pads.

Figure 3:
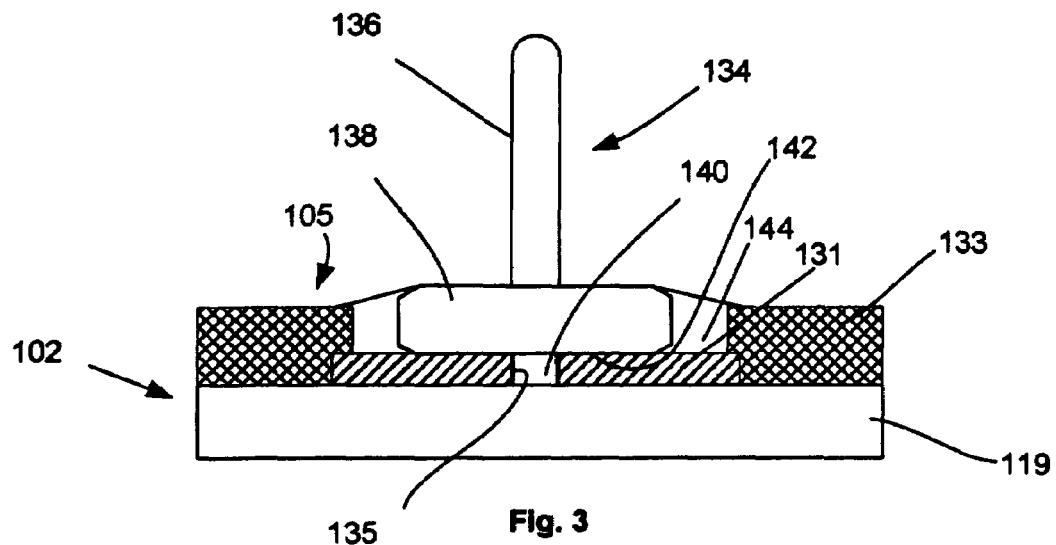
FIG. 3 is a schematic, side cross-sectional view of a PGA joint according to one embodiment.
Figure 4:
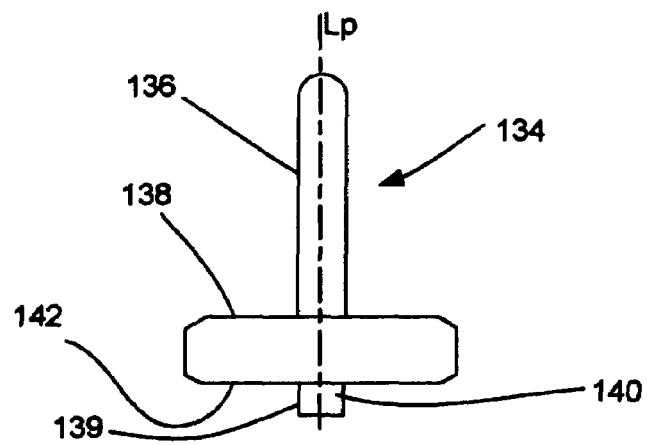
FIG. 4 is a schematic, side cross-sectional view of the pin in the PGA joint of FIG. 3.
Figure 5:
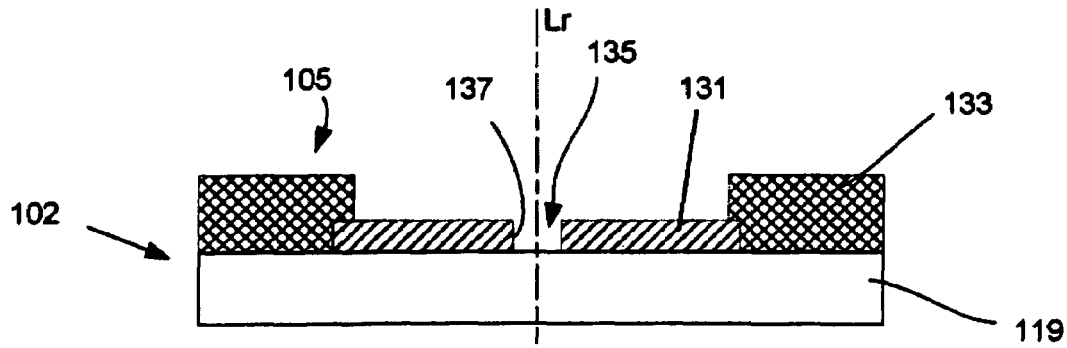
FIG. 5 is a schematic, side cross-sectional view of a land pad region of the PGA joint of FIG. 3.

Referring now to the embodiments of FIGS. 3-5, a side cross-sectional view is shown of a PGA joint including one of the pins 134 of FIG. 2 in a state where the pin 134 is shown as being mounted onto substrate 102. According to embodiments, as shown by way of example in FIGS. 2-5, the land pads 131 of the array 130 on the PCB-side surface of the substrate define anchoring recesses 135 therein, and the pins 134 of the array 132 have anchoring elements 140 thereon mated with corresponding ones of the anchoring recesses 135 of the land pads 131, the anchoring elements 140 and anchoring recesses 135 being configured such that a mating thereof inhibits a tilting of the pins 134 on the land pads 130. In the shown embodiment of the pins, each pin 134 includes a pin stem 136 and a pin head 138 attached to the pin stem, the anchoring element 140 comprising an anchoring projection extending from an underside surface 142 of the pin head 138. By "underside surface" of the pin head, what is meant in the context of embodiments is a surface of the pin head opposite a surface of the pin head to which the pin stem is attached, and extending in a direction that has a component adapted to extend parallel to a surface of the land pad of the substrate to which the pin head is to be attached. In the shown embodiment, the pin stem 136 extends in a substantially perpendicular direction with respect to the pin head 138. Each pin head 138 is shown as being mounted onto a corresponding land pad 131 of the array 130 onto the PCB-side surface 105 of substrate 102 using a pin-attach solder joint 144 as shown. As seen in FIGS. 2-5, the pin-attach solder joint 140 electrically and mechanically bonds an underside 142 of pin head 138 to the PCB-side surface 105.

Referring in particular to FIGS. 3-5, a land pad 131 is shown according to embodiments defining an anchoring recess 135 therein. The anchoring recess is adapted to receive the anchoring element 140 of the pin 134 therein. In the shown embodiment, the land pad includes a single anchoring recess 135 extending through an entire thickness of the land pad 131, and the pin head includes a single anchoring element 140 adapted to mate, as shown, with the recess 135. As seen in FIG. 3, a mating of the anchoring element 140 with anchoring recess 135 inhibits a tilting of the pin 134, since walls 137 of the anchoring recess 135 act as stops with respect to a tilting movement of the pin 134 by virtue of their engagement with the anchoring element 140. In the shown embodiment of FIGS. 3-5, the anchoring element 140 has a longitudinal axis that is coextensive with a longitudinal axis Lp of the pin stem 136. In addition in the shown embodiment, the anchoring recess 135 has lateral walls 137 that extend parallel to a longitudinal axis Lr of the anchoring recess, and the anchoring element 140 has lateral walls 139 that extend parallel to a longitudinal axis Lp of the anchoring element. According to one embodiment, the anchoring element 140 and the anchoring recess have complimentary substantially cylindrical configurations.

Embodiments are not limited, however, to a pin including a pin head and a pin stem, and include within their scope an elongated pin (in the shape of pin stem 136, for example) without a pin head (not shown), a part of which elongated pin is adapted to be mated with a complimentary anchoring recess (such as anchoring recess 135 of FIGS. 3-5) such that a mating thereof with the recess inhibits a tilting of the pin on the land pad, such as land pad 130. In addition, embodiments are not limited to a single anchoring element on any given pin, but include within their scope a pin having a plurality of anchoring elements (not shown), in which case a corresponding land pad would define a plurality of anchoring recesses adapted to mate with the plurality of anchoring elements on the pin. Moreover, although the anchoring recess 135 in the shown embodiment of FIGS. 3-5 is shown as a through-recess (that is, a recess extending through an entire thickness of the land pad 131, embodiments include within their scope the provision of anchoring recesses that extend only partially through a thickness of the land pad. Moreover, although embodiments are described in relation to a pin having an anchoring element, and a corresponding land pad defining an anchoring recess adapted to mate with the anchoring element, embodiments are not so limited, and include within their scope the provision of an anchoring element (having the same characteristics, for example, as described herein in relation to the anchoring element of a pin) on a land pad (such as, for example, land pad 131 of FIG. 34, and the provision of a pin head defining an anchoring recess (having the same characteristics, for example, as described herein in relation to the anchoring recess of a land pad) therein adapted to mate with the anchoring element of the land pad to inhibit a tilting of the pin in the land pad.

Advantageously, the provision of mating anchoring elements and recesses according to embodiments, such as the anchoring element 140 and anchoring recess 135 of FIGS. 3-5, provide a tilt stop for the pin, and in this way substantially prevent pin tilt and thus allow for the formation of a robust pin-attach solder joint.

Figure 6:
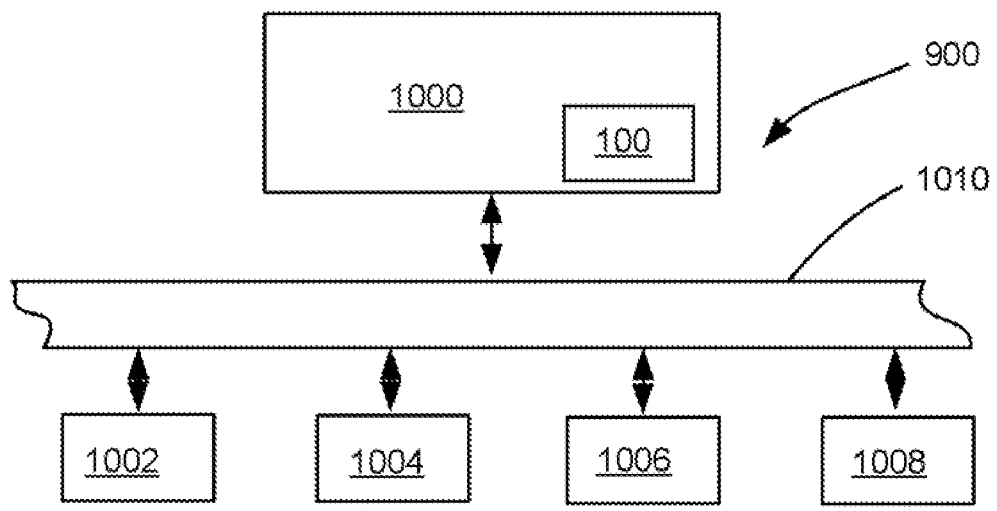
FIG. 6 is a schematic view of an embodiment of a system incorporating a microelectronic package as shown in FIG. 2.

Referring to FIG. 6, there is illustrated one of many possible systems 900 in which embodiments of the present invention may be used. In one embodiment, the electronic assembly 1000 may include a microelectronic package, such as package 100 of FIG. 2. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 6, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic package substrate comprising:
a die-side surface adapted to receive a die thereon;
a printed circuit board (PCB)-side surface adapted to be mechanically and electrically bonded to a PCB;
an array of land pads on the PCB-side surface, the land pads defining anchoring recesses therein, wherein the anchoring recesses have sidewalls and a bottom;
an array of electrically conductive pins electrically and mechanically bonded to respective ones of the land pads, the pins having anchoring elements thereon mated with corresponding ones of the anchoring recesses of the land pads, the anchoring elements mating with the sidewalls and the bottom of the anchoring recesses to inhibit a tilting of the pins on the land pads; and
a plurality of pin-attach solder joints mechanically and electrically bonding the pins to corresponding ones of the land pads.

2. The substrate of claim 1, wherein the pins include respective pin stems and respective pin heads attached to corresponding ones of the pin stems, the pin heads being mounted onto a corresponding one of the land pads and including the anchoring elements, the anchoring elements projecting from an underside surface of corresponding ones of the pin heads.

3. The substrate of claim 2, wherein:
each of the land pads defines a single anchoring recess therein; and
each of the pin heads includes a single anchoring element adapted to mate with a corresponding recess of said each of the land pads.

4. The substrate of claim 2, wherein:
each of the land pads defines a plurality of anchoring recesses therein; and
each of the pin heads includes a plurality of anchoring elements adapted to mate with corresponding recesses of said each of the land pads.

5. The substrate of claim 3, wherein the single anchoring element has a longitudinal axis coextensive with a longitudinal axis of the pin stem.

6. The substrate of claim 1, wherein:
each of the anchoring recesses has lateral walls extending parallel to a longitudinal axis of said each of the anchoring recesses; and
each of the anchoring elements has lateral walls extending parallel to a longitudinal axis of said each of the anchoring elements.

7. The substrate of claim 1, wherein the anchoring recesses include through recesses wherein the bottom is provided by the PCB-side surface.

8. An electrically conductive pin comprising:
a pin stem; and
a pin head attached to the pin stem, the pin head being adapted to be mounted by way of pin-attach solder onto a surface of a substrate to support the pin stem, the pin head having an anchoring element projecting from an underside surface thereof, the anchoring element being configured to be mated with sidewalls and bottom of an anchoring recess defined in a land pad of the substrate adapted to receive the pin thereon.

9. The pin of claim 8, wherein the pin head includes a single anchoring element projecting from an underside surface thereof.

10. The pin of claim 8, wherein the pin head includes a plurality of anchoring elements projecting from an underside surface thereof.

11. The pin of claim 8, wherein the single anchoring element has a longitudinal axis coextensive with a longitudinal axis of the pin stem.

12. The pin of claim 8, wherein the anchoring element has lateral walls extending parallel to a longitudinal axis of the anchoring element.

* * * * *